(12) United States Patent
Hiltunen et al.

(10) Patent No.: US 7,911,019 B2
(45) Date of Patent: Mar. 22, 2011

(54) REFLOWABLE CAMERA MODULE WITH IMPROVED RELIABILITY OF SOLDER CONNECTIONS

(75) Inventors: Jari Hiltunen, Mouhijarvi (FI); Ian Montandon, Wokingham (GB)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 12/724,928

(22) Filed: Mar. 16, 2010

(65) Prior Publication Data

US 2010/0171192 A1     Jul. 8, 2010

Related U.S. Application Data

(62) Division of application No. 11/959,308, filed on Dec. 18, 2007, now abandoned.

(51) Int. Cl.
    *H01L 31/00* (2006.01)
(52) U.S. Cl. ............... 257/459; 257/432; 257/E21.508; 257/E31.113
(58) Field of Classification Search .............. 257/432, 257/433, E31.127
    See application file for complete search history.

(56) References Cited

U.S. PATENT DOCUMENTS

| | | | |
|---|---|---|---|
| 6,762,495 B1 | 7/2004 | Reyes et al. | |
| 2002/0025099 A1* | 2/2002 | Williams et al. | 385/14 |
| 2002/0027271 A1* | 3/2002 | Vaiyapuri | 257/676 |
| 2003/0170921 A1 | 9/2003 | Akram | |
| 2005/0140025 A1 | 6/2005 | Murtuza | |
| 2005/0258518 A1 | 11/2005 | Yang et al. | |
| 2006/0171698 A1 | 8/2006 | Ryu et al. | |
| 2006/0231952 A1 | 10/2006 | Kim et al. | |
| 2007/0052827 A1 | 3/2007 | Hiltunen | |
| 2008/0111707 A1 | 5/2008 | Kim | |
| 2009/0134483 A1* | 5/2009 | Weng et al. | 257/432 |

FOREIGN PATENT DOCUMENTS

KR     20020002536     1/2002

OTHER PUBLICATIONS

PCT Patent Application No. PCT/US08/86966, International Search Report & Written Opinion mailed Mar. 31, 2009, 11 pages.
U.S. Appl. No. 11/959,308, Restriction Requirement mailed Jul. 6, 2009, 9 pages.
U.S. Appl. No. 11/959,308, Response to Restriction Requirement filed Aug. 6, 2009, 4 pages.
U.S. Appl. No. 11/959,308, Office Action mailed Oct. 19, 2009, 10 pages.

* cited by examiner

*Primary Examiner* — N Drew Richards
*Assistant Examiner* — Mamadou Diallo
(74) *Attorney, Agent, or Firm* — Lathrop & Gage LLP

(57) ABSTRACT

A reflowable camera module has a set of solder joints formed on a bottom surface of the camera module that provide electrical signal and power connections between the camera module and a printed circuit substrate. The solder joints are susceptible to failure caused by shear forces, particularly in corner regions. Additional localized mechanical supports are provided to protect those solder joints carrying power and electrical signals for the camera module. The localized mechanical supports are formed outside of a region containing the solder joints carrying power and electrical signals. The localized mechanical supports may include dummy solder joints formed in corner regions and/or dummy leads used to support the camera module. Solder joint reliability is enhanced without requiring the use of an underfill encapsulant.

9 Claims, 4 Drawing Sheets

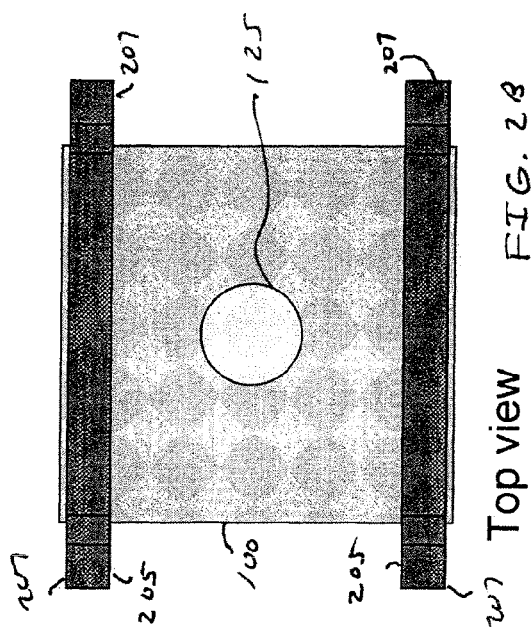
FIG. 2B Top view
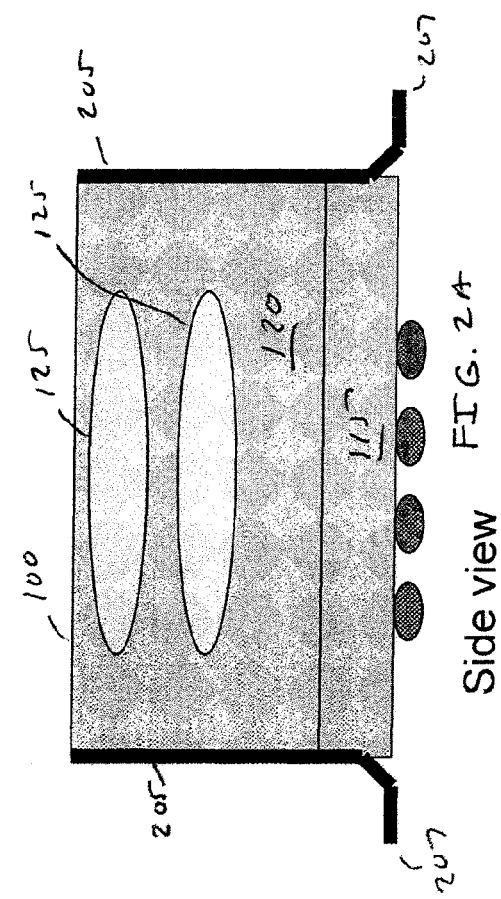
FIG. 2A Side view
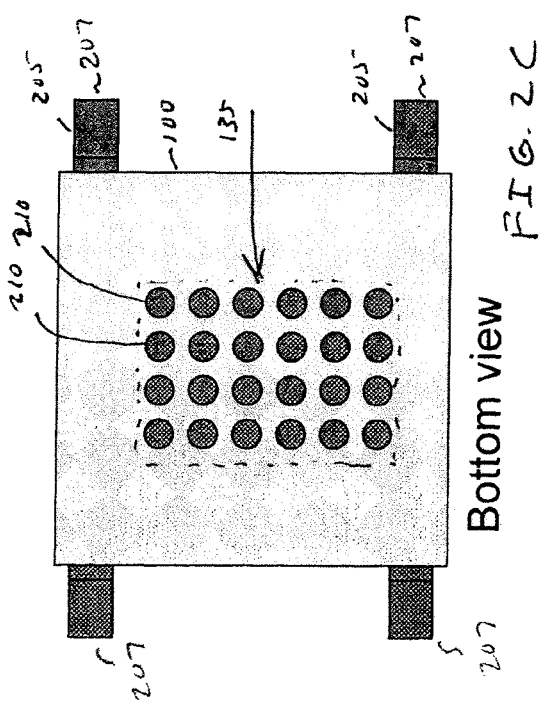
FIG. 2C Bottom view

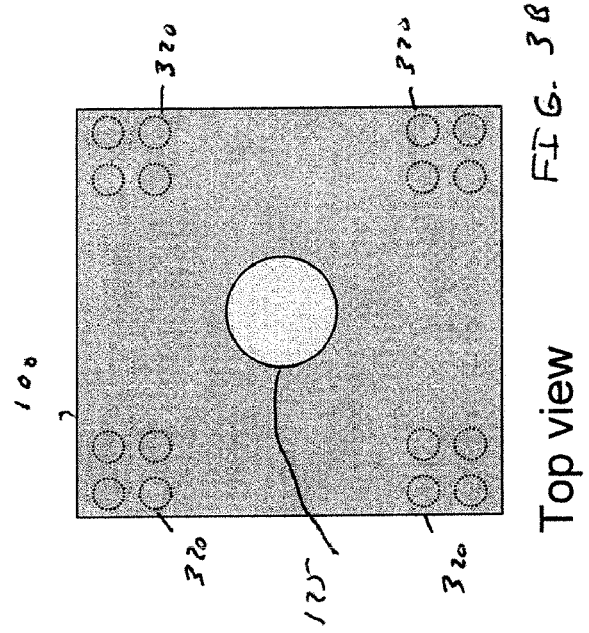
FIG. 3B Top view
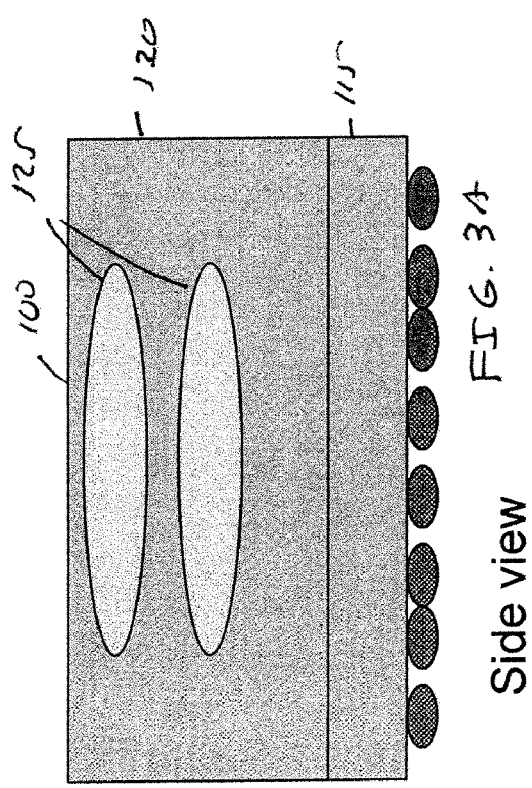
FIG. 3A Side view
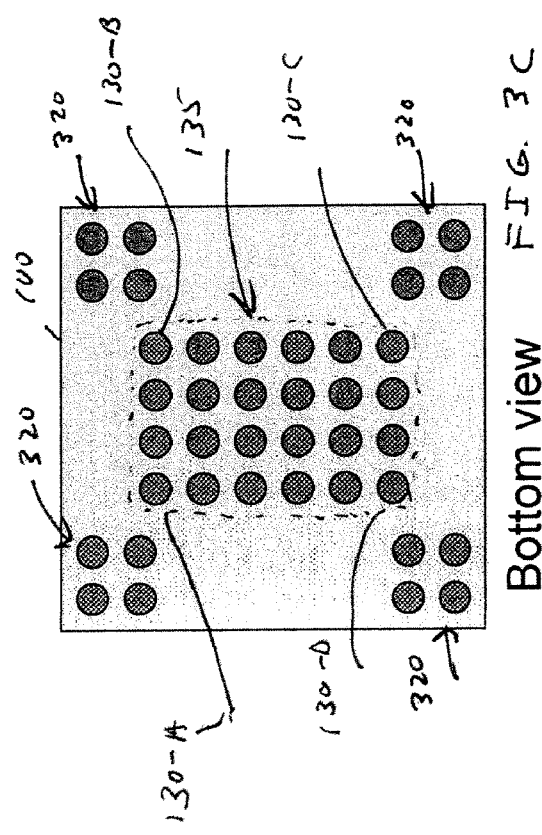
FIG. 3C Bottom view

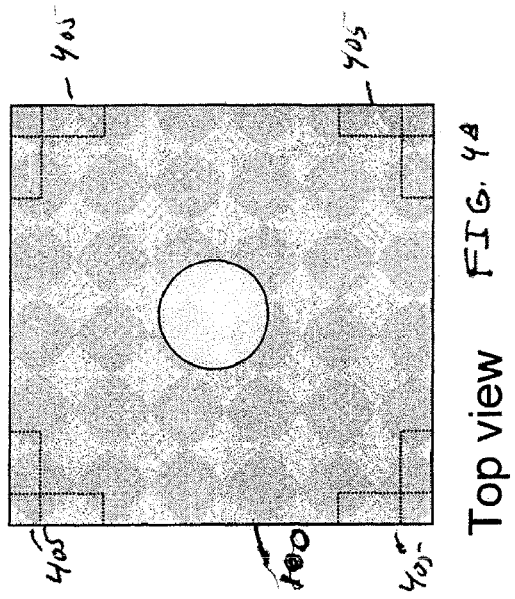
FIG. 4A Top view
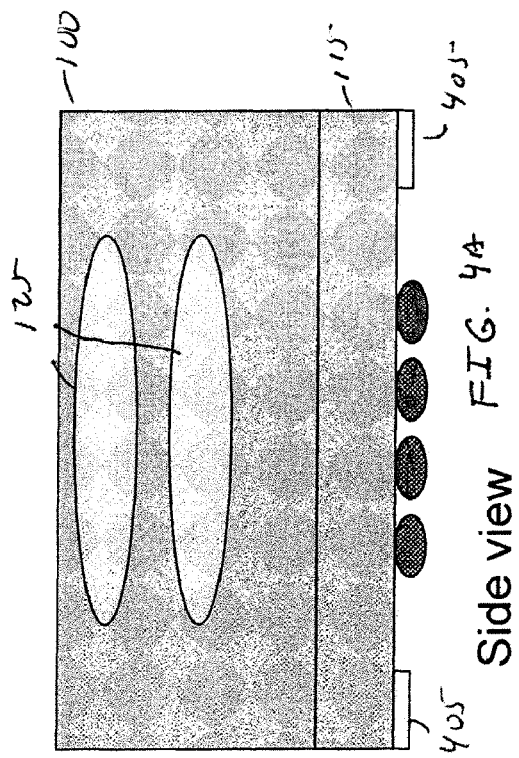
FIG. 4B Side view
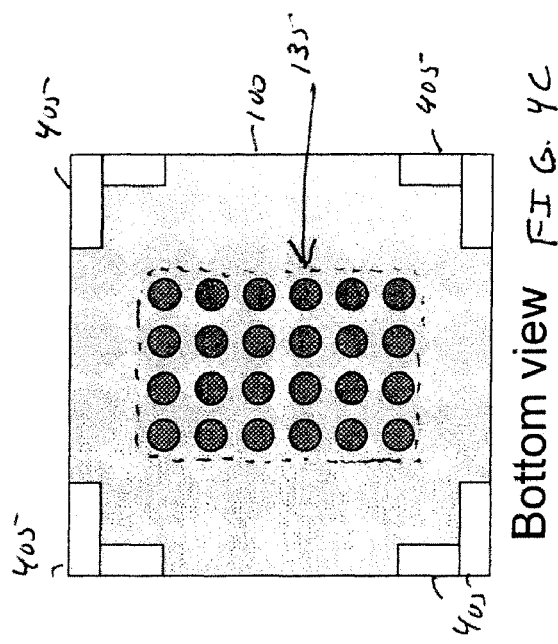
FIG. 4C Bottom view

REFLOWABLE CAMERA MODULE WITH IMPROVED RELIABILITY OF SOLDER CONNECTIONS

RELATED APPLICATIONS

This application is a divisional of U.S. patent application Ser. No. 11/959,308 filed Dec. 18, 2007 now abandoned, which is incorporated herein by reference.

FIELD OF THE INVENTION

The present invention is generally related to techniques to improve the reliability of solder connections in a Chip Scale Package (CSP). More particularly, the present invention is directed to improving the reliability of solder joint connections in a reflowable camera module.

BACKGROUND OF THE INVENTION

Compact consumer devices increasingly include digital cameras. As one example, camera phones include a digital camera to capture digital images.

One technique to manufacture digital cameras for high volume consumer applications is to package an image sensor into a reflowable camera module using a Chip Scale Package. A Chip Scale Package (CSP) is a type of integrated circuit carrier. There are various definitions for CSP packages that are used in industry for current generation CSP packages, such as the package having an area no greater than about 1.2 times the size of the die and/or the ball pitch being no greater than one millimeter. An interposer may be used with a CSP package. Alternatively, in some implementations the die is directly mounted to the CSP package.

In a reflowable camera module, an image sensor die has an array of light sensitive pixels and may, for example, be implemented as a Complementary Metal Oxide Semiconductor (CMOS) image sensor. A CSP carrier forms the base of the reflowable camera module; i.e., a camera module that can be reflowed onto a printed circuit substrate using a solder reflow technique, such as reflowing a Ball Grid Array (BGA) of solder balls to form solder joints with a printed circuit board. Other conventional process steps include plating the module after reflow. Background information on reflowable camera modules utilizing a wafer-level Chip Scale Package (CSP) is described in more detail in U.S. Pat. Pub. No. 20070052827 by Hiltunen "Coated Wafer Level Camera Modules and Associated Methods," the contents of which is hereby incorporated by reference.

Solder joint reliability is a concern in reflowable camera modules. Reflowable camera modules include optical elements and are thus comparatively large modules (in terms of height) compared to other types of CSP components. Additionally, reflowable camera modules are typically included in consumer products, such as camera phones, that are likely to be repeatedly dropped during their lifetime.

One approach in the prior art that may be applied to packaging reflowable camera modules is to use an underfill encapsulant to improve the reliability of solder joint connections. An underfill encapsulant is conventionally a polymeric material that is formed to fill the entire gap between a substrate (either a chip or an interposer) and a printed circuit board. It is important with conventional underfilling techniques that there are no voids ("bubbles") between the substrate and the motherboard. The underfill encapsulant provides additional environmental protection to the solder joints. However, underfill encapsulation processes significantly increase manufacturing costs and hence are disfavored in many types of high volume manufacturing processes.

In light of the above-described problems the apparatus, system, and method of the present invention was developed.

SUMMARY OF THE INVENTION

A reflowable camera module utilizes solder joints to form electrical power and signal connections between an image sensor and a printed circuit substrate to which the reflowable camera module is mounted. However, during assembly, testing, and use the solder joints are subject to shear forces. Additional mechanical support is provided to improve the reliability of the solder joints. Reliability of the solder joints coupling electrical signals and power between the motherboard and the image sensor is improved by including additional localized mechanical supports about each corner of the camera module.

In accordance with an embodiment of the present invention, the reflowable camera module is preferably packaged without utilizing an underfill encapsulant. In one implementation, the additional mechanical supports include leads attached over the camera module to provide additional lateral mechanical support. In another implementation, dummy solder joints are formed proximate corner regions. The dummy solder joints provide additional mechanical support but do not couple electrical signals or power to the image sensor. The dummy solder joints may be formed using solder balls or a solder paste.

BRIEF DESCRIPTION OF THE FIGURES

The invention is more fully appreciated in connection with the following detailed description taken in conjunction with the accompanying drawings, in which:

FIGS. 2A, 2B, and 2C illustrate in more detail an embodiment in which the localized mechanical supports include leads;

FIGS. 3A, 3B, and 3C illustrate in more detail an embodiment in which the localized mechanical supports include dummy solder balls formed in corner regions; and FIGS. 4A, 4B, and 4C illustrate in more detail an embodiment in which the localized mechanical supports include dummy solder paste regions formed in corner regions.

Like reference numerals refer to corresponding parts throughout the several views of the drawings.

DETAILED DESCRIPTION OF THE INVENTION

Figure 1:
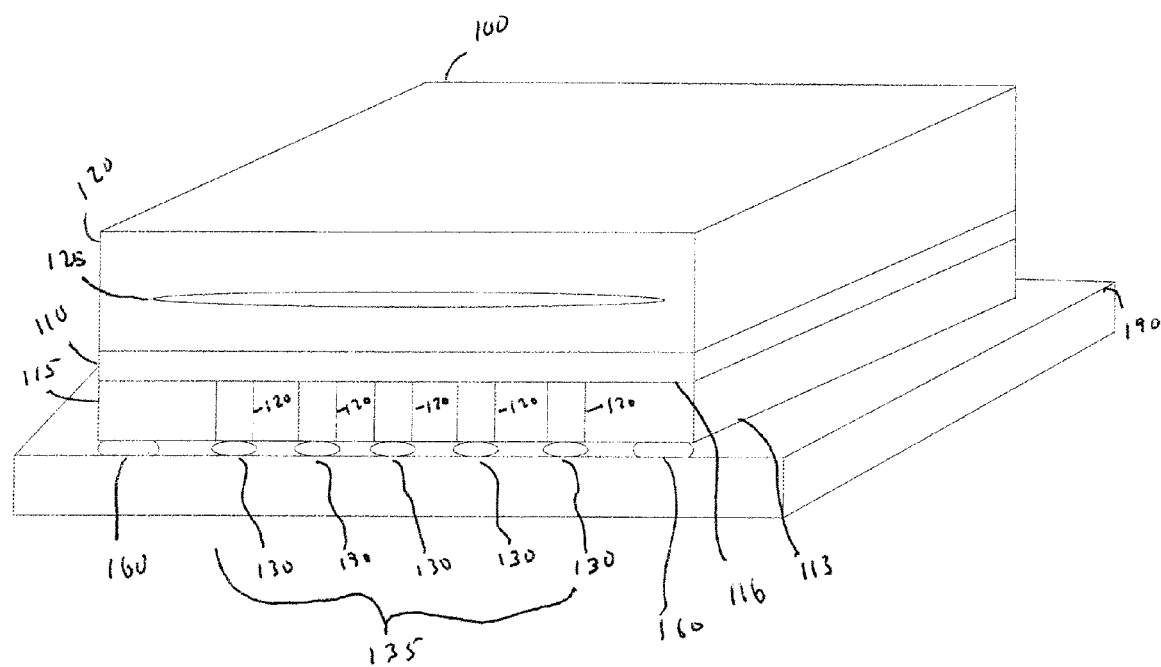
FIG. 1 is a perspective view of a camera module having additional localized mechanical supports to protect solder joints in accordance with one embodiment of the present invention.

FIG. 1 illustrates a perspective view of a reflowable camera module 100 mounted to a printed circuit substrate 190 in accordance with one embodiment of the present invention. The printed circuit substrate 190 may be any conventional substrate used to establish electrical connections between different components, such as a conventional printed circuit board, a motherboard, or a flex package. An image sensor 110 is mounted to a Chip Scale Package (CSP) carrier 115. The CSP carrier 115 has a rectangular shape with four corners. The image sensor 110 has an array of light sensitive pixels and may, for example, be implemented as a Complementary Metal Oxide Semiconductor (CMOS) image sensor. The CSP carrier 115 forms the base of a reflowable camera module 100; i.e., a camera module that can be reflowed onto printed circuit substrate 190 using a solder reflow technique to form solder joints 130 between the bottom surface 113 of the camera module 100 and the printed circuit motherboard 190. As one example, the CSP carrier 115 may have contact regions 120 formed within the CSP 115 carrier to permit electrical signal and power connections to be made between the printed circuit substrate 190 and the image sensor 110. The image sensor 110 is mounted to a top surface 116 of the CSP carrier 115.

In one implementation, a Ball Grid Array (BGA) of solder balls is used to form solder joints 130 (to provide electrical signal and power connections) with the printed circuit substrate 190 using a reflow process. The solder joints 130 that are intended to provide electrical signal and power connections are formed in a central portion 135 of the bottom surface 113 of the camera module 100. However, the central portion 135 does not extend all of the way to the edges of the camera module 100.

The camera module 100 is preferably manufactured using a wafer level CSP manufacturing process in which an entire wafer is capped with an optical (glass) capping layer 120 before the wafer is diced into individual units. Wafer-level lens elements 125 are formed into glass capping layer 120 of the camera module 100 to focus light onto the image sensor 110. The general principles of designing a wafer-level Chip Scale Package (CSP) camera module are described in U.S. Pat. Pub. No. 20070052827 by Hiltunen "Coated Wafer Level Camera Modules and Associated Methods," the contents of which is hereby incorporated by reference.

As illustrated in FIG. 1, additional localized mechanical supports 160 are provided to protect the solder joints 130 in central portion 135 from shearing. The mechanical supports 160 are in localized regions about the edges of the camera module and serve to protect the solder joints 130 in central portion 135 during assembly, testing, and the lifetime of the camera module 100. Investigations by the inventors indicate that shear forces tend to crack the outermost solder joints particularly in corner regions. It is believed that this failure mode has aspects unique to reflowable camera modules. Camera modules typically have a height on the order of several millimeters. The geometry of a camera module generates greater shear forces than other types of CSP packages that have a package height of about one millimeter. That is, when BGA component height is increased the shear forces on the solder joints tends to increase when a side load is introduced, such as may occur during drop testing or other assembly processes. The increased height of camera modules thus renders them more susceptible to shear forces than many other types of CSP packages. Additionally, in high-volume camera applications underfilling encapsulants are typically not used with camera modules for cost reasons. As a result in a reflowable camera module (without underfilling) BGA ball shear can occur, particular for those solder joints located near the corners of camera module 100.

In accordance with the present invention, the additional localized mechanical supports 160 protect against BGA ball shear without utilizing an underfill encapsulant. As described below in more detail, these protective localized mechanical supports 160 are preferably located about at least the corners of the CSP carrier 115 because it is the BGA solder joints proximate the corners that are most likely to fail due to BGA ball shear.

The additional mechanical supports 160 are preferably formed using process steps that are compatible with a high-volume reflow process. One exemplary process to form the additional mechanical supports 160 includes forming dummy solder joints. As used in this patent application, a "dummy solder joint" is a solder joint formed to provide mechanical support but which does not couple electrical power or signals to the image sensor 110. However, a dummy solder joint may be connected to a ground plane, if desired, to control the electrical potential of the dummy solder joint. The dummy solder joints are preferably formed in the same reflow step used to form those solder joints 130 that couple electrical signals and power to the image sensor 110. Another exemplary process to form the additional mechanical supports 160 includes using leads extended over the surface of the camera module 100 to provide additional mechanical support. In this example, the leads are used for mechanical purposes and may therefore also be described as "dummy leads" since they do not couple electrical power or signals to the image sensor 110 but instead are used to mechanically support the reflowable camera module 100. Still yet another exemplary process to form the additional mechanical supports 160 includes forming a bead of an epoxy along selected portions of the edge of the reflowable camera module 100 outside of central portion 135. These techniques may be used either alone or in combination.

FIGS. 2A, 2B, and 2C illustrate in more detail aspects of a process in which additional mechanical supports 160 are formed using two or more leads 205. FIG. 2A illustrates a side view with certain conventional features omitted for clarity. FIG. 2B illustrates a top view of the leads 205 extending over the camera module. FIG. 2C illustrates a bottom view of the underside of the camera module further illustrating bottom solder ball contact pads 210 within central portion 135 (illustrated by dashed lines). The ends 207 of each lead 205 extend out from the camera module 100 and are attached to the printed circuit substrate (not shown), thus providing additional lateral support of the camera module 100 to provide protection against shear forces. As illustrated in FIG. 2A, each lead 205 is preferably attached to the outer surface of the camera module 100 such that each lead 205 conforms to the profile of the camera module 100 and extends over the sides and top of the outer surface of the camera module with the ends 207 proximate corner regions of camera module 100. In one implementation the two ends 207 of each lead 205 are attached to the printed circuit substrate (e.g., using epoxy or solder) before a final plating process used to plate the reflowable camera module 100 to form an electromagnetic shield. Thus each lead 205 is a dummy lead in that the leads 205 are preferably grounded and do not couple electrical power or signals to the camera module 100. The leads 205 may be conventional leads, such as copper alloy based leads. While an exemplary process has two leads 205, it will be understood that a different number of leads may be used (e.g., one, two, three, or four leads, with the upper limit depending on practical manufacturing limitations) and that the arrangement of the leads may differ from that illustrated in FIGS. 2A, 2B, and 2C.

FIGS. 3A, 3B, and 3C illustrate in more detail fabrication details for a process in which the mechanical supports 160 are dummy solder joints formed from solder balls 320. FIG. 3A is a side view illustrating solder joints formed across the underside of the carrier 115. As illustrated in phantom in the top view of FIG. 3B, dummy solder balls 320 are preferably formed in the corner areas. As illustrated in the bottom view of FIG. 3C, the central portion 135 (bounded by dashed lines for the purposes of illustration) includes a BGA of solder balls for forming electrical signal and power connections with the camera module 100. This embodiment effectively utilizes some of the extra area about the edges of the CSP package to form the dummy solder balls. In an exemplary arrangement, there are four dummy solder balls 320 in each corner region.

As previously described, the corner-most solder joints formed at the location of solder balls 130-A, 130-B, 130-C, and 130-D will tend to be the most susceptible to shear-induced cracking. Thus, in this arrangement the dummy solder balls 320 act to protect the solder balls 130-A, 130-B, 130-C, and 130-D in central portion 135. As each corner has four dummy solder balls 320, there is also some beneficial redundancy of the dummy solder balls 320 in case an individual dummy solder ball 320 cracks or is otherwise rendered incapable of providing mechanical support. It will also be understood that additional dummy solder balls 320 could be included along the edge of the CSP carrier 115 and/or in a different pattern than that illustrated in FIGS. 3A, 3B, and 3C.

FIGS. 4A, 4B, and 4C illustrates in more detail fabrication details for a process in which localized mechanical support 160 is provided using solder joints formed in corner solder areas 405 using a solder paste technique. Corner solder areas 405 are exposed and plated (e.g., with copper). That plated areas may be attached to the motherboard during the reflow process via a solder paste and may, for example, be connected into EMI shielding or alternatively left floating. FIG. 4A illustrates a bottom view; FIG. 4B illustrates a top view showing corner areas in phantom, and FIG. 4C illustrates a bottom view.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

What is claimed is:

1. A method of improving reliability of solder joint connections in a reflowable camera module, the method comprising:
    forming solder joints that provide electrical signal and power connections to the camera module via a solder reflow process between a central portion of a bottom surface of a carrier of the reflowable camera module and a printed circuit substrate; and
    forming additional local mechanical supports outside of the central portion of the bottom surface of the reflowable camera module
    wherein the additional local mechanical supports protect the solder joints that provide electrical signal and power connections to the camera module from shear forces, and
    wherein said forming additional local mechanical supports includes forming at least two leads over a surface of the camera module and attaching ends of the at least two leads to the printed circuit substrate.

2. The method of claim 1, wherein said forming additional local mechanical supports comprises forming dummy solder joints in corner regions of the bottom surface via the solder reflow process, the dummy solder joints providing mechanical support but not coupling electrical signals or power to the camera module.

3. The method of claim 2, wherein the dummy solder joints are formed using solder balls.

4. The method of claim 2, wherein the dummy solder joints are formed using a solder paste extending over a corner region.

5. The method of claim 1, wherein said forming additional local mechanical supports comprises forming epoxy beads proximate corner regions.

6. A reflowable camera module, comprising:
    a Chip Scale Package (CSP) carrier, the carrier defining a rectangular surface area having a first side, a second side, and four corners;
    an image sensor mounted to the first side of the CSP carrier;
    an optical capping layer having at least one optical lens element covering the image sensor;
    solder contact regions formed in a central portion of the second side of the CSP carrier dedicated to provide electrical signal and power connections between the image sensor and a printed circuit substrate after a reflow process; and
    at least one lead extending over an outer surface of the camera module and having at least two first lead ends extending out from the camera module to be attached to the printed circuit substrate to provide additional lateral mechanical support to protect solder joints between the printed circuit substrate and the camera module.

7. The camera module of claim 6, further comprising a second lead having at least two second lead ends, the at least one lead and the second lead extending over the outer surface of the camera module and having the at least two first and second lead ends extending out to be attached to the printed circuit substrate to provide lateral mechanical support to corner regions.

8. The camera module of claim 7, wherein the at least one lead and the second lead are attached conformably to at least two sides and a top surface of the camera module.

9. The camera module of claim 6, wherein the at least one lead is coupled to ground.

* * * * *